United States Patent [19]

Ikeda et al.

[11] 4,329,641
[45] May 11, 1982

[54] ANALOG-TO-DIGITAL TESTER

[75] Inventors: Masayuki Ikeda; Kenji Aoki, both of Suwa, Japan

[73] Assignee: Kabushiki Kaisha Suwa Seikosha, Tokyo, Japan

[21] Appl. No.: 1,336

[22] Filed: Jan. 5, 1979

Related U.S. Application Data

[63] Continuation-in-part of Ser. No. 701,845, Jul. 1, 1976, abandoned.

[30] Foreign Application Priority Data

Jul. 1, 1975 [JP] Japan .................................. 50/81556

[51] Int. Cl.³ .......................................... G01R 15/08
[52] U.S. Cl. .................................. 324/115; 324/99 D
[58] Field of Search ............. 324/115, 131, 111, 99 D; 340/347 AD, 347 NT

[56] References Cited

U.S. PATENT DOCUMENTS

| | | | |
|---|---|---|---|
| 2,870,408 | 1/1959 | Draganjac | 324/115 |
| 3,187,323 | 6/1965 | Flood et al. | 324/115 |
| 3,652,934 | 3/1972 | Paljug et al. | 324/115 |
| 3,790,886 | 2/1974 | Kurtin et al. | 324/99 D |
| 4,034,291 | 7/1977 | Allen et al. | 324/115 |
| 4,050,019 | 9/1977 | Nirschl | 324/115 |
| 4,105,967 | 8/1978 | Macemon | 324/115 |

*Primary Examiner*—Ernest F. Karlsen
*Attorney, Agent, or Firm*—Blum, Kaplan, Friedman, Silberman and Beran

[57] ABSTRACT

An analog-to-digital tester having at least two distinct ranges of full scale sensitivity is provided. The tester includes signal conditioning means for receiving an analog measurand and digital display for displaying a value representative of the measurand. The signal conditioning means includes first and second attenuation levels differing by a multiple of at least 100 and circuit means for selecting the attenuation level corresponding to the magnitude of the measurand. The analog-to-digital converter circuit has full scale sensitivity over a first range and additionally full scale sensitivity over a second range ten times greater than the first range and includes range detecting means for detecting the magnitude of the measurand applied to the signal conditioning means and in response thereto selects the first or second full scale sensitivity range to thereby apply a digital value representative of the measurand to the digital display. Combinations of selected sensitivity and attenuation levels provide at least four ranges of measurand values for display. Measurands include AC voltage, DC voltage and resistance.

19 Claims, 7 Drawing Figures

ANALOG-TO-DIGITAL TESTER

CROSSREFERENCE TO RELATED APPLICATIONS

This application is a Continuation-In-Part application of our co-pending application, Ser. No. 701,845, filed July 1, 1976, now abandoned.

BACKGROUND OF THE INVENTION

This invention is directed to an analog-to-digital tester, and in particular to an analog-to-digital tester including an analog-to-digital converter having two ranges of full scale sensitivity differing by a multiple of ten to two attenuation levels differing by a multiple of a hundred whereby in combinations of sensitivity and attenuation four ranges are provided for display.

Heretofore, in the prior art, digital display testers for producing digital representations of voltage, current, resistance and the like, have been provided with manual or automatic range changing circuitry. For example, when a voltage is applied to the input circuitry, the range of the voltage is detected by automatic range changing circuitry, which circuitry selects an attenuation level corresponding to the range of the voltage to be measured. Attenuation is effected by selectively energizing relays associated with the specific range of attenuations. However, power consumption in such relays is excessive and the cost of such relays in miniaturized circuitry is considerable. The attenuation network in conventional digital output testers includes a network of resistors usually having ratios of resistance, one to the other, of 1:1, 1:10, 1:100 and 1:1000. These ratios must be very accurately produced and the resistor elements must have high resistance to voltage breakdowns. As such the attenuator is one of the most expensive parts in the conventional digital tester. Although efforts have been made to substitute semiconductor switches for the relays, such efforts have been less than completely satisfactory due to the resistance breakdown voltages which are required. Accordingly small size in the attenuators and in the switches has not been achieved What is needed is an analog-to-digital tester in which the number of components in the attenuator circuitry is reduced, the number of switch contacts is reduced, the voltage breakdown requirements are reduced and wherein semiconductor switches are utilized to replace bulkier components and miniaturization is thereby achieved.

SUMMARY OF THE INVENTION

Generally speaking, in accordance with the invention, an analog-to-digital tester is provided. The tester includes signal conditioning means for receiving an analog measurand and a digital display for displaying a value representative of the measurand. The signal conditioning means includes first and second attenuation levels differing by a multiple of at least one hundred and circuit means for selecting the attenuation level corresponding to the magnitude of the measurand. The analog-to-digital converter circuit has full scale sensitivity over a first range and additionally full scale sensitivity over a second range ten times greater than the first range and includes range detecting means for detecting the magnitude of the measurand applied to the signal conditioning means. In response thereto, the first or second full scale sensitivity range is selected to thereby apply a digital value representative of the measurand to the digital display. Combinations of selected sensitivity and attenuation levels provide at least four ranges of measurand values for displays. Measurands include AC voltage, DC voltage and resistance.

Accordingly, it is an object of this invention to provide an improved digital display voltage and resistance tester.

Another object of the instant invention is to provide a digital display tester that admits of reduced power consumption.

Still another object of the instant invention is to provide a digital display tester that is inexpensive and easy to operate.

Yet another object of the instant invention is to provide a digital display tester that is inexpensive and simple to manufacture.

A still further object of the instant invention is to provide a digital display tester which uses few resistors in its attenuation networks and provides a multitude of output display ranges.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
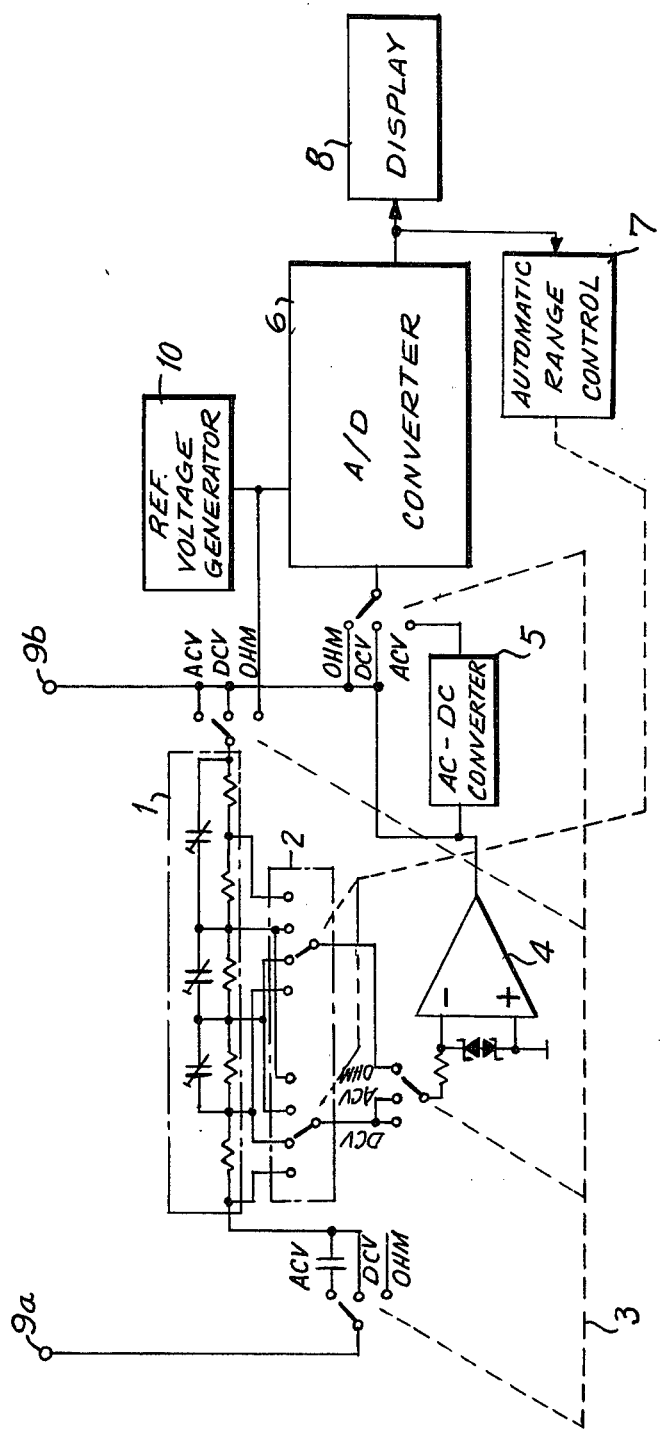
FIG. 1 is a schematic circuit of a conventional digital tester of the prior art.
Figure 6:
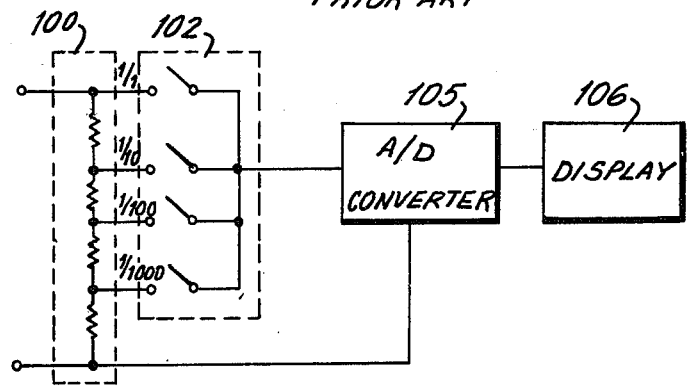
FIG. 6 is a schematic circuit similar to FIG. 1.

An example of a typical digital tester of the prior art is shown in FIG. 1 and generically in FIG. 6.

In such a typical analog-to-digital tester the electrical quantities for measurement include AC voltage, DC voltage and resistance. The measurand ranges of voltage could typically be 0 to 2 volts, 0 to 20 volts, 0 to 200 volts and 0 to 2000 volts. The typical ranges for resistance could be 0 to 2000 ohms, 0 to 20,000 ohms and 0 to 200,000 ohms and 0 to 2,000,000 ohms. Accordingly the maximum output of analog-to-digital conversion is 1999. The digital tester of FIG. 1 includes an attenuator 1, a group of range switches 2, function switches 3, that is, measuring AC voltage or DC voltage or ohms. The operational amplifier 4 is interposed between the attenuator 2 and the AC-DC converter 5 and the analog-todigital converter 6 and a display unit 8. The largest components which prevent miniaturization are the switches. Especially, the conventional range switches 2 are inevitably large sized because they must possess high voltage breakdown resistance and a high intercontact insulation resistance. It should be noted that the attenuator 1 includes five resistors for the purpose of producing four output ranges as discussed above. Also, the range switches 2 necessarily include two four-position switches in order to cut the attenuation resistors into and out of the circuits as required to satisfy the four ranges of output.

As can be seen in the prior art, for example, U.S. Pat. Nos. 3,981,006; 3,313,924; and 3,987,435, it is possible to automatically set the range switches 2 to the most desirable range by means of a control circuit 7. It is generally desirable in digital testers, as in analog testers, that the value of the measurand fall well within the display range rather than at either the lower or upper extreme. However, in order to provide switches which can be automatically set to provide range control, it becomes necessary to use components which are large sized and which consume large amounts of electrical power. Moreover, among the components used in the conventional digital tester (FIG. 1), the most expensive component is the attenuator 1. The attenuator as shown must be able to divide the voltage accurately by using resistors which are sized in relationship, one to the other, by the ratios of 1:1, 1:10, 1:100 and 1:1000. These ratios must be accurate if the output is to be accurate. Further these resistors in addition to being precision resistors must be able to withstand high voltages, for example in the ranges cited above, a maximum of 2000 volts.

Figure 2:
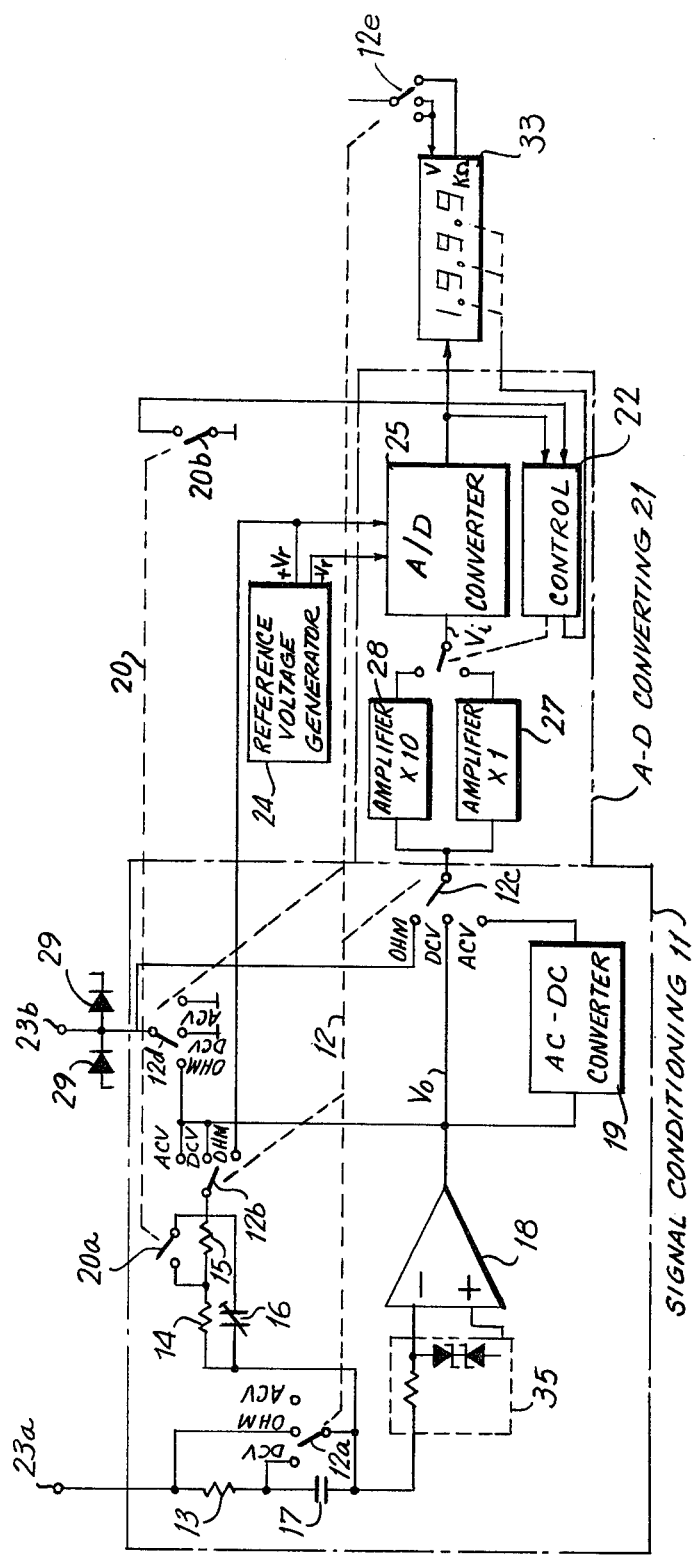
FIG. 2 is a schematic circuit of a digital tester according to this invention.

The analog-to-digital tester of this invention eliminates the above-mentioned structural deficiencies of the conventional digital tester of the prior art and provides a new construction by which the number of components in the attenuator, the breakdown voltage, and the number of contacts in the switches are all reduced. The performance requirements for the switches are less severe and semiconductor switches can be adopted whereby miniaturization is carried out. FIG. 2 shows an analog-to-digital tester according to this invention. The signal conditioning means 11, surrounded by a broken line, converts all magnitudes of electrical potential inputs to levels suited to the circuitry.

Switches 12a to 12e are function switches operating simultaneously to perform a changeover in accordance with the nature of the quantity to be measured. In the illustrated embodiment of FIG. 2, the parameters which are measurable are DC voltage, AC voltage, and resistance. The voltages are measured in volts and the resistance is measured in ohms. The function switches 12a to 12d provide for changes within the signal conditioning means 11. Information transmitted to the display device 33 is switched over by switch 12e, for example, a user is informed whether the presently measured function will be indicated in volts, ohms, kilohms, etc.

Switches 20 affect the range of the output display. As explained hereinafter, the switch 20a changes over the gain of the signal conditioning means 11, and the switch 20b provides an input to the control circuit 22 in the analog-to-digital converting portion 21. One result of the operation of the switches 20, which are ganged together for simultaneous performance, is that the user is informed of the selected range for inputs by a movement in the position of the decimal point on the output display 33.

The operational amplifier 18 is the main component in the signal conditioning means 11. As explained hereinafter, the ranges in magnitude of the parameters to be measured within the scales of the display unit 33 are determined by the gain of the operational amplifier 18. When voltage is measured, two resistances 14, 15 provide the inverted feedback from the output of the operational amplifier 18 to its input terminal. The resistance 15 is short circuited from the feedback circuit when switch 20a is closed to reduce the gain of the operational amplifier 18. When the function switches 12 are set to measure DC voltage, and it should be noted that all switches 12a to 12e are ganged to move in unison, the output of the operational amplifier 18 is a DC voltage which is fed directly to the inputs of the amplifiers 27, 28. When the function switches 12 are set to measure AC voltage, then the output $V_0$ of the amplifier 18 is diverted through the AC-DC converter 19 before it is presented to the input of the amplifiers 27, 28. Also, the capacitor 17 is shorted from the circuit by switch 12a when a DC voltage is to be measured and is effective in the circuit when an AC voltage is to be measured. Because of the action of the switch 12c and the AC-DC converter 19, the input to the amplifiers 27, 28 is always a DC voltage regardless of whether the input to be measured is an AC or a DC voltage.

The output of the signal conditioning means 11, after passing through one of the amplifiers 27, 28 is inputted to the analog-to-digital converter 25 and the output therefrom drives the display 33 to provide a visual digital indication of the value of the input parameter. The voltage source 24 provides a constant level voltage output for use in the analog-to-digital converter 25 and for use when resistance is to be measured by the tester of this invention. As stated above, the control circuit 22, in response to the setting of the range switch 20b and the second range switch 26, positions the decimal point of the visual output display 33. Switch 12e provides for a visual indication on the output unit 33 to give evidence whether the parameter being measured is voltage or ohms.

Figure 3:
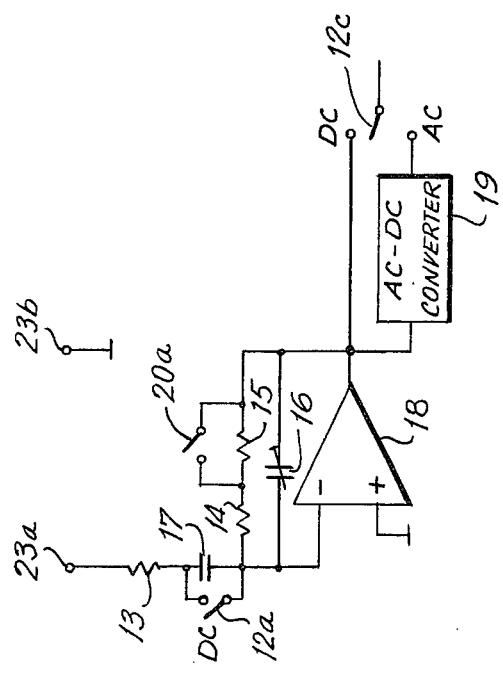
FIG. 3 is a portion of the schematic of FIG. 2 showing the connections at the time of measuring voltage.
Figure 4:
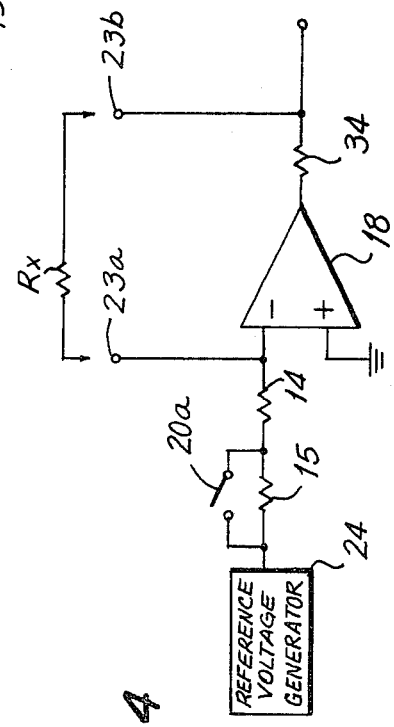
FIG. 4 is a portion of the schematic of FIG. 2 showing the connections at the time of measuring resistance.

FIG. 3 is a simplified drawing of the signal conditioning means 11 showing the circuit configuration for the measurement of voltage, AC voltage or DC voltage. The contacts of switches 12b and 12d have been omitted and only the closed circuit is shown. The connection of the function switches at a time of measuring resistance values is shown in FIG. 4 which is also a simplified circuit of the signal conditioning means 11.

When a voltage is measured (FIG. 3), the operational amplifier 18 operates as an inverting amplifier with negative feedback provided by the resistances $R_1$, $R_2$ and $R_3$. The resistances $R_1$, $R_2$ and $R_2$ are indicated in FIG. 3 by the numbers 13, 14 and 15 respectively. The capacitor 16 in parallel with $R_2$ and $R_3$ is provided to improve the frequency response characteristics when an AC voltage is measured. The capacitor 17 is in the circuit when an AC voltage is measured to cut off any DC voltage level upon which the measured AC signal is superimposed. When a DC voltage is measured, the capacitor 17 is short-circuited by the function switch 12a. The output $V_0$ of the signal conditioning means 11 passes through the AC-DC converter 19 when the switch 12c is in the AC position. Otherwise the output of the amplifier 18 is delivered directly from the signal conditioning means 11. Thus, by the use of the AC to DC conversion circuit 19 the output Vo of the operational amplifier 18 is presented only as a DC output.

When the measurand, that is, the voltage which is to be measured, is inputted at the input terminals 23a and 23b (FIG. 3), the output voltage of the signal conditioning means 11 is represented mathematically as follows:

When the first range switch 20a is open, $$V_o = -\frac{R_2 + R_3}{R_1} V_x.$$

When the first range switch 20a is closed, $$V_o = -\frac{R_2}{R_1} V_x.$$

In the above equations, if $R_2/(R_2=R_3)=1/100$, when the first range switch 20a is open, then $$V_o = -100\alpha V_x,$$

and when the first range switch 20a is closed, $$V_o = -\alpha V_x,$$

where $\alpha = R_2/R_1$.

When a resistance $R_x$ of unknown value is to be measured (FIG. 4), the operational amplifier 18 operates as an inverting amplifier with negative feedback provided by resistances $R_2$ and $R_3$ and the measured resistance $R_x$. As is well known in the art, resistance measurements are generally made on unpowered circuits. Therefore the tester must provide a voltage from an internal source. In a tester in accordance with this invention, a reference voltage $V_r$ of constant value is outputted by the constant reference voltage generator 24.

When a resistance $R_x$ to be measured is connected to the input terminals 23a, 23b, the output voltage $V_o$ of the signal conditioning means 11 is represented mathematically as follows:

When the first range switch 20a is closed, $$V_o = -\frac{R_x}{R_2} V_r = -100 \beta R_x V_r,$$

and when the first range switch 20a is open, $$V_o = -\frac{R_x}{R_2 + R_3} V_r = -\beta R_x V_r,$$

where $\beta = 1/R_2$ (A), and A is the above-stated relationship of resistors $R_2/(R_2+R_3)=1/100$.

The resistance 34 in FIG. 4 represents the closed contact resistance of the function switch 12d. However, since the resistance 34 is but one small element in the feed-back loop, its presence does not lead to an error of any significance. The closed contact resistance of the range switch 20a can also be made small enough in comparison with the resistances $R_2$ and $R_3$ so that the switch resistance is of no significance. Similarly, the contact resistances in switch 12c are made small enough in comparison to the input impedance of the analog-to-digital converting portion 21 so that this contact resistance does not lead to an error.

The analog-to-digital converting portion 21 (FIG. 2) consists of the analog-to-digital converter 25, a second range switch 26, an amplifier 27 of unity gain in parallel with an amplifier 28 having a gain of ten, and the control circuit 22. The analog-to-digital converter 25 compares the analog voltage $V_i$ with the reference voltage $V_r$, to quantify the analog voltage $V_i$ and convert it into a digital value. The analog voltage $V_i$ inputted to the analog digital converter 25 is the output of the amplifier 28 or the parallel amplifier 27 depending on the position of switch 26. The value D of digital output is represented mathematically as follows:

$$D = \left(\gamma \frac{V_i}{V_r}\right),$$

where [] is a symbol which represents that quantification has been carried out. Methods and circuitry for the conversion of analog signals to digital outputs are well known and need no further explanation herein.

It should be noted that when the second range switch 26 is connected to the amplifier 27 having unity gain, then the input $V_i$ to the analog-to-digital converter 25 is equal to the output $V_o$ of the signal conditioning means 11. When the second range switch 26 is connected to the amplifier 28 having a gain of ten, then the input $V_i$ to the analog-to-digital converter 25 is ten times the value of the output $V_o$ of the signal conditioning means 11. Accordingly, the voltage input $V_i$ to the analog-to-digital converter 25 is dependent on the positions of switches 26 and 20a. Because both of these switches are single-pole-double-throw switches the number of possible combinations is four and the number of ranges which can be indicated at the output 33 is correspondingly four.

That is to say, when measuring voltages:

(i) when the first range switch 20a is open and the second range switch 26 is connected to the amplifier 28 of gain 10, $$D = -1000 \left(\alpha\gamma \frac{V_x}{V_r}\right).$$

(ii) when the first range switch 20a is open and the second range switch 26 is connected to the amplifier 27 of gain 1, $$D = -100 \left(\alpha\gamma \frac{V_x}{V_r}\right)$$

(iii) when the first range switch 20a is closed, and the second range switch 26 is connected to the amplifier 28 of gain 10, $$D = -10 \left(\alpha\gamma \frac{V_x}{V_r}\right)$$

(iv) when the first range switch 20a is closed and the second range switch 26 is connected to the amplifier 27 of gain 1, $$D = -\left(\alpha\gamma \frac{V_x}{V_r}\right)$$

When measuring resistance:

(i) when the first range switch 20a is closed and the second range switch 26 is connected to the amplifier 28 of gain 10, $$D = -1000 [\beta\gamma Rx]$$

(ii) when the first range switch 20a is closed and the second range switch 26 is connected to the amplifier 27 of gain 1, $$D = -100[\beta\gamma Rx]$$

(iii) when the first range switch 20a is open and the second range switch 26 is connected to the amplifier 28 of gain 10, $$D = -10[\beta\gamma Rx]$$

(iv) when the first range switch 20a is open and the second range switch 26 is connected to the amplifier 27 of gain 1, $$D = -[\beta\gamma Rx]$$

Moreover, in accordance with the desired quantative range to be measured and indicated in the display 33, the resistances $R_1$, $R_2$ and $R_3$ $\alpha$, $\beta$, $\gamma$ and the reference voltage $V_r$ can be determined with considerable ease using the above disclosed equations. As an example, when $R_1 = 10$ megohms, $\gamma = 1$, and $V_r = 1000$ volts, and the maximum value of digital output D equals 1999, the following values are obtained from the equations:
$R_2 = 10,000$ ohms,
$R_3 = 990,000$ ohms,
$\alpha = 1/1000$, and
$\beta = A \times 10^{-4}$.

Values of the output voltage $V_o$ from the signal conditioning means 11 and the voltage $V_i$ inputted to the analog-to-digital converter 25 are indicated in the Tables below. It should be noted that in measuring voltages between 0 and 1999 volts, the input $V_i$ to the analog-to-digital converter 25 never exceeds 1.999 volts, which after conversion will drive the display 33 to its maximum limit. The entire range of measured voltage is divided into four sub-ranges having the ratios 1, 10, 100 and 1000. It is by the switching of the first range switch 20a and the amplifiers 27, 28 that these individual ranges are achieved, all within the voltage limits acceptable in the analog-to-digital converter 25.

TABLE I

| | When measuring voltage: | | | |
|---|---|---|---|---|
| Range of measured voltage Vx | 0 ~ 1.999 V | 0 ~ 19.99 V | 0 ~ 199.9 V | 0 ~ 1999 V |
| First range switch 20a | OPEN | OPEN | CLOSED | CLOSED |
| Gain of amplifier selected by second range switch 26. | 10 | 1 | 10 | 1 |
| Vo | 0 ~ 199.9 mV | 0 ~ 1.999 V | 0 ~ 199.9 mV | 0 ~ 1.999 V |
| Vi | 0 ~ 1.999 V | 0 ~ 1.999 V | 0 ~ 1.999 V | 0 ~ 1.999 V |

The resistance values which can be measured within the capabilities of the analog-to-digital converter 25 and the display 33 is from 0 ohms up to 199 kilohms. This entire range of resistance is divided into four subranges having the ratios of 1, 10, 100 and 1000.

TABLE II

| | When measuring resistance: | | | |
|---|---|---|---|---|
| Range of measured resistance Rx | 0 ~ 1.999 KΩ | 0 ~ 19.99 KΩ | 0 ~ 199.9 KΩ | 0 ~ 1999 KΩ |
| First range switch 20a | CLOSED | CLOSED | OPEN | OPEN |
| Gain amplifier selected by second range switch 26 | 10 | 1 | 10 | 1 |
| Vo | 0 ~ 199.9 mV | 0 ~ 1.999 V | 0 ~ 199.9 mV | 0 ~ 1.999 V |
| Vi | 0 ~ 1.999 V | 0 ~ 1.999 V | 0 ~ 1.999 V | 0 ~ 1.999 V |

Figure 5:
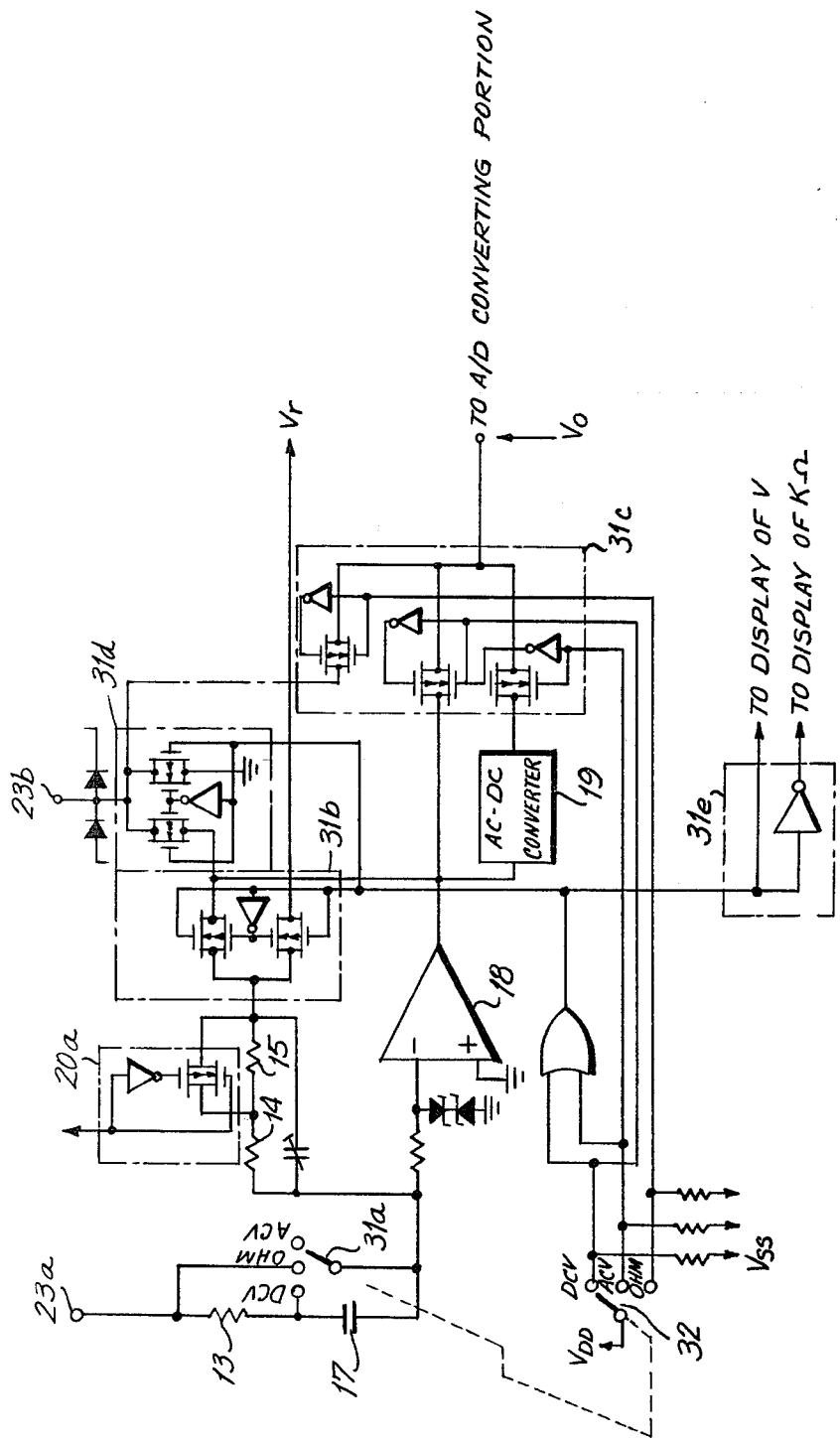
FIG. 5 is the schematic of an alternative embodiment of an analog-to-digital tester of this invention using semiconductor switches in a circuit otherwise similar to the circuit of FIG. 2.

The circuits illustrated in FIGS. 2, 3 and 4 show conventional multicontact switches for the performance of all switching functions. FIG. 5 shows a similar circuit wherein all switches except the function switch 12a are semiconductor switches, whereby miniaturization and low power consumption are achieved. FIG. 5 shows MOS transistors, made of C-MOS integrated circuits used as switches. More particularly, semiconductor switches 31b, 31c and 31d in FIG. 5 correspond to the switches 12b, 12c and 12d in FIG. 2 respectively. The switch 31a in FIG. 5, which corresponds to the switch 12a in FIG. 3, is a mechanical switch and operates in synchronism with the mechanical switch 32. The mechanical switch 32 generates the potential signals which control the semiconductor switches. The circuit 31e performs similarly to the switch 12e in FIG. 2, for providing the signal to the display device 33 so as to indicate whether a voltage or a resistance is being measured.

When a voltage is measured the closed resistance of range switch 20a and function switches 31b and 31d are, as semiconductor switches, small enough in comparison with the resistances $R_1$, $R_2$ and $R_3$ so that no significant error occurs in the output readings. Also when semiconductor technique is used, the values of $R_1$, $R_2$ and $R_3$ cited above, namely, 10 megohms, 10,000 ohms and 990,000 ohms respectively, satisfy the requirements for noise, voltage breakdown resistance etc. The voltages applied to the semiconductor switches 20a, 31b, 31c, 31d and 31e are all less than several volts, and the open/closed resistance ratio of the semiconductor switches is about the same as that of a mechanical switch so that special circuitry is not required. Furthermore, in the event that a voltage is applied to the input terminals 23 and 23b in error, when the tester of this invention is in the resistance measuring mode, the operational amplifier 18 can be protected at its inlet from the unintended application of voltage by the protecting circuit 35 which includes a series pair of zener diodes. Also, in such a case where voltage is applied when the tester is in the resistance mode, the switch 20a is protected by the resistance 14, and the output of the operational amplifier 18 and the switches on the output side of the signal conditioning means are protected by the diodes 29 associated with input terminal 23b.

With reference to FIG. 5, it should be noted that when the mechanical switch 32 is in the DC voltage position, the output of the OR gate 40 is high and transistors 41, 44 and 46 are conductive while transistors 42, 43, 45 and 47 are non-conductive and in effect open circuits. Accordingly, the reference voltage $V_r$ is not applied to the circuit of FIG 5 and the AC-DC converter 19 is not in circuit.

When the mechanical signal generating switch 32 is in the AC voltage position, the OR gate 40 is high at its output and transistors 41, 44, and 47 are conductive, whereas transistors 42, 43, 45, and 46 are non-conductive and effectively open circuits. In this AC voltage mode, the reference voltage $V_r$ is not applied to the circuit, but the AC-DC converter 19 is now in series with the output of the operational amplifier 18. The circuit of FIG. 5, whether in the AC or DC voltage mode, is similar to the circuit shown with mechanical switches in FIG. 3.

When the mechanical signal generating switch 32 of FIG. 5 is in the ohms position, the output of the OR gate 40 is low and transistors 42, 43, and 45 are conductive whereas transistors 41, 44, 46 and 47 are non-conductive and effectively open circuited. In this mode, the constant reference voltage $V_r$ is applied to the resistor 15. However, the AC-DC converter 19 is not in circuit.

It should be understood that the analog-to-digital converting portion 21 can be designed to change over its gain by modifying the gain of the analog-to-digital converter 25 directly without employing amplifiers for example, amplifiers 27, 28 as shown in FIG. 5. Such circuitry is shown in the prior art U.S. Pat. No. 3,987,435 and the Japanese Patent Publication No. 10290/69. Also, according to the U.S. Pat. No. 3,617,885, it is possible to automatically change the gain of the analog-to-digital converter 25 in accordance with the output of that converter 25, so that the most desirable range is always set automatically. Moreover, it is also possible to control the first range switch 20a as well as the second range switch 26 automatically by a signal from the control circuit 22, and semiconductor switches can be used for those switches 20a, 26 which results in a circuit of low power consumption and small size of parts.

However, an attempt to design a digital tester having more than four ranges by using the conventional techniques of the prior art as described immediately above, requires that the switches or semiconductor elements should possess performance characteristics such as high voltage resistance or high insulation resistance which results in an extremely high cost for each part as well as high power consumption and large size. It has not been possible to achieve miniaturization, low power consumption and low cost until the circuitry according to this invention has been employed. The operational amplifier 18, semiconductor switches, AC to DC converter 19, and the analog-to-digital converting portion 21 including the amplifiers and analog-to-digital converter, can all be manufactured by known C-MOS processes. Further, by the use of a display element of low power consumption, for example, a liquid crystal display device, a digital tester using little power can be provided.

By employing the structure for a digital tester according to this invention, circuit parts, especially switches can be miniaturized, the number of parts is reduced, and digital testers of low cost, capable of being operated easily because of automatic functions to set the desirable output range, can be produced.

Whereas the prior art (FIGS. 1, 6) relies solely on attenuator resistance networks for range modifications, and the embodiments of FIGS. 2-6 rely upon changes in amplifier gain, in an alternative embodiment of this invention, the range control is provided by a combination of attenuator resistances and a variable analog to digital converter.

FIG. 6 is a semi-schematic circuit of a digital tester of the prior art presented in a functionally generic manner. Like the more detailed circuit drawing of FIG. 1, FIG. 6 illustrates a tester relying solely upon a selection among proportioned resistors for control of ranges in the measurands.

In FIG. 6, attenuator circuit 100 having four distinct attenuation levels 1/1, 1/10, 1/100, 1/1000 has each of the respective attenuation levels coupled through a corresponding relay of switching circuit 102 to the input of a conventional analog-to-digital converter circuit 105. The analog-to-digital converter circuit 105 is coupled to a liquid crystal display 106, which display is adapted to display a digital representation of the analog value converted by the analog-to-digital converter circuit 105.

Specifically, in operation, a predetermined unknown measurand value, such as voltage, is applied to the input circuit 100, including the respective attenuation levels selected by switching circuit 102, and is converted by the converter circuitry 105 to be displayed as a digital representation by the display 106. The switching circuit 102 automatically detects the range of the voltage and in response thereto is adapted to select the specific attenuation level required. For example, if the analog-to-digital converter is adapted to convert voltages over a range of 0.2 V to 2.0 V, and a value within that range is introduced through the input circuit 100, the switching circuit 102 automatically energizes the relay associated with the 1/1 attenuation level and closes such relay to thereby apply the analog voltage directly to the analog-to-digital converter circuit 105 without any attenuation. Nevertheless, if the voltage to be measured were between 2.0 V and 20.0 V, the switching circuit would automatically select the 1/10 attenuation level in order to reduce the voltage value to the range over which the analog-to-digital converter circuitry is capable of producing digital representations thereof. A disadvantage of the digital display tester circuitry depicted in FIG. 6, is that the switching circuit 102 consumes considerable amounts of power, in operation, and, hence, rapidly exhaust the battery utilized to energize the digital display tester. Moreover, because the attenuation levels are often varied by multiples of $10^3$ from 1/1 to 1/1000 by the automatic adjustment circuitry, replacement of the relays in the switching circuit with semi-conductor switching elements to thereby reduce power consumption is clearly precluded. Specifically, the ratio of OFF (OPEN) resistance to ON (CLOSED) resistance of each semi-conductor device must be sufficiently large so as to exceed the differences in attenuation levels and it is noted that the ratio of OFF resistance to ON resistance in semi-conductor switches of the type utilized in digital tester circuits are not capable of exceeding a change in attenuation level of $10^3$. Moreover, an additional difficulty in utilizing semi-conductor switching elements is that the breakdown voltages over ranges of $10^3$ are not easily provided, thereby rendering it necessary to utilize relay switches and the attendant high power consumption that obtains therefrom.

Figure 7:
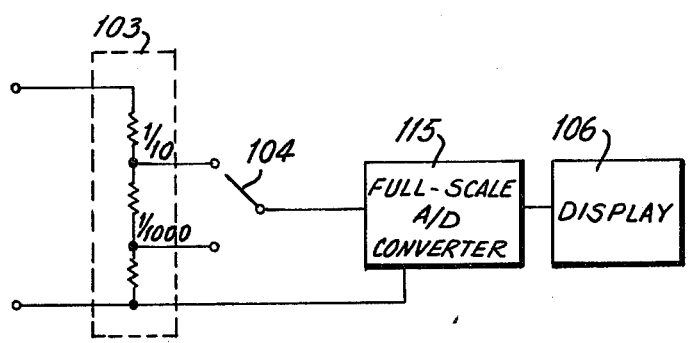
FIG. 7 is an alternative embodiment of the digital tester of this invention.

Reference is now made to FIG. 7, wherein a digital display voltmeter constructed in accordance with the instant invention is depicted, like reference numerals being utilized to denote like elements depicted above. The digital voltmeter includes 3½ figures to be displayed and is provided with a four range capability of which the full ranges are 0.2 to 2, 2 to 20, 20 to 200, and 200 to 2000 volts. Moreover, the digital display utilizes liquid crystal elements and the analog-to-digital converter circuitry is formed of C-MOS elements to reduce the power consumption thereof.

The voltage measurand in analog form is applied through the input circuitry 103 and switch 104 to the full-scale analog-to-digital converter circuit 115, which converter circuit is provided with two distinct ranges of full-scale sensitivity, differing by a multiple of 20. By way of example, the normal full-scale sensitivity of the analog-to-digital converter circuit can be up to 200.0 mV or 2000 mV. Providing two ranges of full-scale sensitivity in the analog-to-digital converter is obtainable by utilizing a conventional voltage sensitive MOSFET switching circuit in combination with a conventional dual-slope integration analog-to-digital converter circuit such as the analog-to-digital converter circuitry depicted and described in co-pending U.S. Application Ser. No. 527,717, now U.S. Pat. No. 3,987,435 which application is incorporated by reference as if fully set forth herein.

It is noted that use of a dual-slope analog-to-digital converter requires that a voltage to be measured is integrated from a predetermined reference level in linearly increasing fashion for a predetermined period of time, whereafter a secondary reference voltage having a polarity opposite to the polarity of the measured voltage is integrated to reduce the level of the integrated signal until same returns to the primary reference voltage level. The time required to return to the reference voltage level is measured and thereafter is displayed by the digital display. A second range of full-scale sensitivity ten times larger than the first range of full-scale sensitivity of the dual-slope analog-to-digital converter circuitry can be obtained: by increasing the period of time over which the analog voltage to be converted is integrated by a multiple of ten; or by decreasing by 1/10 the primary reference voltage; or by changing the time constants of the integrator which positively integrates the analog measurand voltage and negatively integrates the second reference voltage by a factor of 1:10. In other words, a conventional voltage sensitive MOFSET switching circuit wherein switching is responsive to the threshold voltages of the MOSFETs, can select between two reference voltages, integration times or time constants (or a combination thereof) in the dual-slope analog-to-digital converter to automatically set the dual-slope analog-to-digital converter circuit to one of two full-scale sensitivities different by a factor of 10. By utilizing such techniques, the instant invention is not subject to error, even if semi-conductor switches are utilized, since a factor of 10 is well within the range of such switches, and two distinct ranges of full-scale sensitivity in the analog-to-digital conversion circuitry can be provided. Moreover, the switches in the automatic adjustment circuitry that select the range of full-scale sensitivity do not require high breakdown voltages.

As is illustrated in FIG. 7, if a full-scale dual-slope analog-to-digital converter circuit 115 is utilized having a normal full-scale range of up to 200 mV, a digital voltmeter capable of four ranges (0.2 to 2.0 V, 2.0 to 20.0 V, 20 V to 200 V and 200 to 2000 V) can be obtained by utilizing two distinct manually selected attenuation levels 1/10 and 1/1000 in the input circuitry 103. A single relay can also be used to automatically select between 1/10 and 1/1000 attenuation, in effect a selection between the ranges 0.2 to 20.0 V and 20.0 V and 2000 V. Thus, if an analog voltage in the range of 2.0 to 20 V were applied through the input circuit 103, an attenuation level of 1/10 would be manually or automatically selected in input circuit 103 and the automatic adjustment circuitry in the analog-to-digital converter circuit would detect the attenuated signal and adjust the range of the converter circuit downwardly by a factor of 1/10. Alternatively, if a voltage in the range of 200 to 2000 V were applied, an attenuation level of 1/1000 would be selected automatically or manually. Thus, as is detailed by the table below, the instant invention is particularly characterized by providing an analog-to-digital converter circuit having two distinct ranges of full-scale sensitivity to thereby reduce the switching circuit to a single two-contact switch for selecting either a first or second attenuation level, and if a relay is used, only one contact is needed.

As is detailed in the table below, if the analog-to-digital converter circuit has a first range of full-scale sensitivity to 200.0 mV and a second range of full-scale sensitivity to 2000.0 mV, which is a multiple of 10 with respect to the first range of full-scale sensitivity, the above-noted ranges of 0.2 to 2.0 V, 2.0 to 20 V, 20 to 200 V and 200 to 2000 V is obtained. Accordingly, for purposes of illustration, the table detailed below illustrates the attenuation level of the input circuit 103 selected by the two-contact switch 104 and the distant range of full-scale sensitivity of the analog-to-digital converter circuit selected when the analog value of the voltage is a measurand of 1.739 V, 17.39 V, 173.9 V and 1,739 V.

| Range | Measurand | Attenuation | A/D Scale | Output | Digital Reading |
|---|---|---|---|---|---|
| .2 to 2.0V | 1.739V | .1 | 200mV | 1.739mV | 1.739 $(10^{-3})$ |
| 2.0 to 20V | 17.39V | .1 | 2000mV | 1.739mV | 1.739 $(10^{-2})$ |
| 20 to 200V | 173.9V | .001 | 200mV | 1.739mV | 1.739 $(10^{-1})$ |
| 200 to 2,000V | 1,739V | .001 | 2000mV | 1.739mV | 1.739 $(10^{0})$. |

Accordingly, the table illustrates that the digital reading is identical for each measurand voltage value and that the instant invention provides a digital display voltage tester that utilizes an input circuit having only two attenuation levels and a single semi-conductor switch or relay in contra-distinction to analog-to-digital converter circuits of the prior art that require four distinct attenuation levels, each attenuation level having a relay associated therewith.

It is further noted that even when a manual method of selecting the attenuation level is provided, only two contacts are needed. Therefore, even in a manual operation mode, the full-scale analog-to-digital converter circuit is clearly easier to operate than the four level operation of the prior art.

Finally, it is noted that although the digital display tester is described in FIG. 7 as a voltage tester, the instant invention is equally applicable to all analog measurand values to be measured such as current, resistance, capacitance and the like, provided a stable voltage source is provided for resistance measurements, and an AC-DC converter for AC measurements.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In a digital tester havig functions to measure at least direct current voltage, alternating current voltage and resistance, the improvement comprising:
    a signal conditioning means for generating a DC voltage output in proportion to a quantity of measured input voltage said signal conditioning means including first and second attenuation means for providing two levels of attenuation of said measured voltage input to said signal conditioning means, said first and second attenuation levels differing by a multiple of one hundred, and attenuation switching means cooperating with said first and second attenuation means for selecting one of said attenuation means corresponding to the magnitude of said input voltage measurand,
    analog-to-digital (AD) converter circuit means for converting the analog output signal from said signal conditioning means into a digital value, said analog-to-digital converter means including a switching means for changing-over sensitivity of said analog-to-digital converter circuit means to 1/1 or 1/10, by combinations of attenuation and sensitivity levels the ranges of said measurand values which can be measured and displayed with full scale sensitivity are four; and
    display means for displaying digital numbers corresponding to the output from said analog-to-digital converter circuit means.

2. A digital tester as claimed in claim 1, wherein said attenuation switching means includes a manually operated two-position switch, and said switching means for changing-over sensitivity of said analog-to-digital converter means is constructed of semi-conductor switching elements controlled by circuit means for selecting a desirable sensitivity corresponding to the magnitude of the result of said AD conversion.

3. A digital tester as claimed in claim 1, wherein said attenuation switching means for said signal conditioning means is constructed of semi-conductor switching elements controlled by circuit means for selecting a desirable attenuation factor corresponding to the magnitude of the result of said AD conversion.

4. A digital tester as claimed in claim 1, and further comprising function switching means for adapting said signal conditioning means for input thereto of a plurality of kinds of measurands, said function switching means comprises a manual switch and a semi-conductor switch controlled by the signal obtained from said manual switch.

5. A digital tester as claimed in claim 1, wherein said display means includes a liquid crystal display device.

6. A digital tester as claimed in claim 1, wherein said signal conditioning means includes an operational amplifier, said operational amplifier and the analog-to-digital AD converter, said switching means and a driver of said display means are constructed by integrated circuits produced by monolithic C-MOS process.

7. A digital tester for measuring at least voltage comprising:
    signal conditioning means, said signal conditioning means including:
        input terminals for application thereto of analog voltages to be measured;
        an operational amplifier having an input resistance, and feedback resistance from output to input, said input terminals connecting said measured voltage to said operational amplifier through said input resistance; and
    means to vary said feedback resistance by selected magnitudes, whereby the gain in output of said operational amplifier is varied in selected magnitudes by 100 to 1;
    analog-to-digital conversion means for converting the analog output of said operational amplifier to a quantified signal indicative of the input voltage;
    amplifier means intermediate said operational amplifier and said analog-to-digital conversion means, said amplifier means having selectable gains of 1 or 10, said operational amplifier output signal being inputted to said selectable gain amplifier means, the output thereof being input to said analog-to-digital conversion means;
    display means for displaying said quantified signal, said quantified output of said analog-to-digital conversion means depending in magnitude on both the selected gain of said intermediate amplifier means and the selected gain of said operational amplifier and four ranges with full scale sensitivity are provided.

8. The digital tester of claim 7, and further comprising a capacitor, said capacitor being selectively inserted in series with said input resistance; and an AC to DC converter, said converter being selectively inserted between said operational amplifier output and the input to said intermediate amplifier means, whereby AC voltages are measured and only DC signals are inputted to said analog-to-digital conversion means.

9. The digital tester of claim 7, and further comprising:
    a reference voltage generator, said reference voltage generator output being selectively connected to one end of said variable feedback resistance, the other end of said feedback resistance being connected to the input of said operational amplifier;
    switching means for selectivey short-circuiting said input resistance; and switching means for selectively connecting said input terminals across the input and output of said operational amplifier, whereby resistance values are selectively measured by the digital tester of this invention.

10. The digital tester of claim 9, wherein said means for varying said feedback resistance, said means for selectively inserting said AC to DC converter, said means for selectively connecting said reference voltage generator and said input terminals includes switches.

11. The digital tester of claim 10, wherein said switches are C-MOS transistors in integrated circuits, and further including control circuit means to control the conduction or non-conduction of said transistors.

12. The digital tester of claim 11, and further including manual function switches to selectively apply power to said control circuit means and selectively insert said capacitor.

13. The digital tester of claim 12, wherein said means to select the gain of said intermediate amplifier means includes C-MOS integrated circuit switches and two amplifiers of different gains.

14. The digital tester of claim 7, wherein said operational amplifier is of the inverting type and feedback is negative.

15. In an analog-to-digital tester including input means for receiving an analog value measurand and digital display means for displaying a digital value representative of the measurand, the improvement comprising analog-to-digital converter circuit means having at least full-scale sensitivity over a first range and full-scale sensitivity over a second range that is ten times greater than said first range, said analog-to-digital converter means including range detecting means for detecting the magnitude of said analog value measurand and in response thereto being adapted to select one of said first and second range of full-scale sensitivity to thereby apply to said digital display means a digital value representative of said analog value measurand, said input means including first and second attenuation, means to provide two levels of input attenuation; said first and second attenuation levels differing by a multiple of one hundred and switching means intermediate said first and second attenuation means for selecting an attenuation level corresponding to the magnitude of said analog voltage measurand, the range of said measurand values that are measured and displayed with full scale sensitivity is at least four, said switching means being a manually operated two-position switch for permitting manual selection of one of said first and second attenuation means.

16. An analog-to-digital tester as claimed in claim 15, wherein said analog-to-digital converter means is formed of C-MOS field-effect transistors.

17. An analog-to-digital tester as claimed in claim 15, said analog-to-digital circuit means being adapted to effect dual-slope integration and provide two distinct ranges of full-scale sensitivity by increasing the period of time over which the analog voltage to be converted is integrated by a multiple of 10 in response to said measurand value being detected by said range detecting means.

18. An analog-to-digital tester as claimed in claim 15, said analog-to-digital circuit means being adapted to effect dual-slope integration and provide two distinct ranges of full-scale sensitivity by decreasing by 1/10 the primary reference voltage in response to said measurand value being detected by said range detecting means.

19. An analog-to-digital tester as claimed in claim 15, said analog-to-digital circuit means being adapted to effect dual-slope integration and provide two distinct ranges of full-scale sensitivity by changing the time constants of the integrator which positively integrates the analog measurand value and negatively integrates an opposite reference voltage by a factor of 1:10 in response to said measurand value being detected by said range detecting means.

* * * * *